US008337133B2

(12) United States Patent
Menser, Jr. et al.

(10) Patent No.: US 8,337,133 B2
(45) Date of Patent: Dec. 25, 2012

(54) SEGREGATING WAFER CARRIER TYPES IN SEMICONDUCTOR STORAGE DEVICES

(75) Inventors: Clayton D. Menser, Jr., Marlboro, NY (US); Louise C. Courtois, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 993 days.

(21) Appl. No.: 11/767,796

(22) Filed: Jun. 25, 2007

(65) Prior Publication Data

US 2008/0317565 A1 Dec. 25, 2008

(51) Int. Cl.
*B65G 65/00* (2006.01)

(52) U.S. Cl. ........................................ 414/270; 700/215

(58) Field of Classification Search .................. 414/411, 414/270; 700/214, 215, 225, 213; 194/901, 194/902, 903, 904, 905, 906
See application file for complete search history.

(56) References Cited

U.S. PATENT DOCUMENTS 4,576,274 A * 3/1986 Thorsen ........................ 194/210
5,751,581 A * 5/1998 Tau et al. ...................... 700/115
5,980,183 A * 11/1999 Fosnight .................. 414/222.01
6,160,905 A * 12/2000 Ahn et al. ..................... 382/141
6,195,006 B1 * 2/2001 Bowers et al. ............. 340/572.1
6,389,707 B1 * 5/2002 Peiter et al. ..................... 33/645
6,579,052 B1 * 6/2003 Bonora et al. ........... 414/222.01
6,591,162 B1 * 7/2003 Martin .......................... 700/228
6,659,263 B2 * 12/2003 Hendrickson et al. ..... 198/347.3
6,711,450 B1 * 3/2004 Conboy et al. ................ 700/115
6,870,797 B2 * 3/2005 Reasoner et al. .......... 369/30.29
6,896,470 B1 * 5/2005 Chen et al. .................... 414/411
6,985,794 B1 * 1/2006 Conboy et al. ................ 700/214
7,005,985 B1 * 2/2006 Steeves ...................... 340/572.1
7,136,721 B2 * 11/2006 Sano et al. .................... 700/215
7,413,396 B2 * 8/2008 Ito ................................ 414/626
7,453,358 B2 * 11/2008 Webster ..................... 340/568.5
2004/0234362 A1 * 11/2004 Iijima et al. ................ 414/222.1
2005/0228526 A1 * 10/2005 Fang et al. .................... 700/115
2006/0182531 A1 * 8/2006 Shah et al. .................... 414/217
2007/0027575 A1 * 2/2007 Chae et al. .................... 700/226

* cited by examiner

*Primary Examiner* — Saul Rodriguez
*Assistant Examiner* — Glenn Myers
(74) *Attorney, Agent, or Firm* — Ian D. Mackinnon; Howard M. Cohn

(57) ABSTRACT

A system for managing the entry of a wafer carrier into a stocker in a semiconductor manufacturing operation is disclosed. The system comprises a stocker that accepts wafer carriers via one or more input ports. The present invention provides a means for detecting the presence of a wafer carrier at the input port, means for identifying the type of the wafer carrier, and means for executing an action sequence if the stocker is not compatible with those wafer carriers. Upon detecting an erroneous condition, an action sequence is executed which may include prevention entry of the wafer carrier, and notifying an operator.

9 Claims, 3 Drawing Sheets

SEGREGATING WAFER CARRIER TYPES IN SEMICONDUCTOR STORAGE DEVICES

FIELD OF THE INVENTION

This invention is generally related to semiconductor fabrication. More specifically, this invention relates to wafer carrier identification and storage in a semiconductor manufacturing environment.

BACKGROUND

In a modern semiconductor manufacturing facility, there is typically an Automated Material Handling System (AMHS) that transports semiconductor wafers to their proper fabrication stations. The AMHS system is comprised of a plurality of transport mechanisms to transport wafers inside of wafer carriers, monitors and sensors to track the positions of wafer carriers, and a computer system which manages this information and performs route optimizations to route the materials to the needed process tools in a way to promote high efficiency of the manufacturing facility. When a process tool finishes processing its current batch of wafers, the system keeps the production line moving by automatically determining the best lot to run next on the equipment.

Every carrier, as well as the wafers inside, is tracked continuously as it moves down the production line, and employees can track the status of a wafer at any stage in the production process. This helps prevent processing mistakes, and allows better inventory control as well as customer service.

The current AMHS is efficient at routing wafers to the needed processing tools in an efficient manner. However, there are limitations in the systems that exist today. The systems do not account for certain safety, business, and security requirements when it comes to the temporary storage of the batches of wafers (referred to as "lots") and wafer carriers while awaiting the next phase in the manufacturing process. What is needed is an improved system for managing the entry of wafers into the temporary storage area.

SUMMARY OF THE INVENTION

The present invention provides a system for managing the entry of a wafer carrier into a stocker in a semiconductor manufacturing operation. The system comprises a stocker having at least one input port, means for detecting the presence of a wafer carrier at the input port, means for identifying the type of the wafer carrier, and means for executing an action sequence if the stocker is not compatible with the type of wafer carrier identified.

The present invention further provides a system wherein the means for identifying the type of wafer carrier comprises an RFID tag affixed to the wafer carrier, the RFID tag storing wafer type information.

The present invention further provides a system wherein the means for identifying the type of wafer carrier comprises an optical pattern affixed to the wafer carrier, the optical pattern corresponding to the wafer carrier type.

The present invention further provides a system wherein the means for identifying the type of wafer carrier comprises a plurality of identification pins on the underside of the wafer carrier, wherein the plurality of identification pins are configured and arranged to form a pattern corresponding to the wafer carrier type, the plurality of identification pins contacting a corresponding plurality of wafer carrier type detection pins disposed on the input port, thereby providing an indication of wafer carrier type.

The present invention further provides a system wherein the plurality of identification pins comprises four identification pins, each of the plurality of identification pins having a first height or a second height, wherein the first height is not equal to the second height, thereby forming a pattern corresponding to the wafer carrier type.

The present invention further provides a system wherein the means for executing the action sequence comprises means for issuing an operator alert.

The present invention further provides a system wherein the means for executing the action sequence comprises means for preventing the wafer carrier from entering the stocker.

The present invention further provides a system wherein the means for preventing the wafer carrier from entering the stocker comprises a stocker having at least one input port, the at least one input port comprising:

a plurality of guide pins disposed to guide the wafer carrier into a loading position;

a plurality of wafer carrier presence detection pins; and a plurality of wafer carrier type detection pins; wherein the wafer carrier comprises a plurality of identification pins on the underside of the wafer carrier, whereby the plurality of identification pins are configured and arranged to engage the plurality of wafer carrier type detection pins, thereby providing an indication of wafer carrier type.

The present invention further provides a system wherein the means for executing the action sequence comprises means for rerouting the wafer carrier.

The present invention further provides a system wherein the means for rerouting the wafer carrier comprises:

means for identifying a compatible stocker; and means for transporting the wafer carrier to the compatible stocker.

The present invention further provides a system for managing the entry of a wafer carrier into a stocker in a semiconductor manufacturing operation comprising:

a stocker, the stocker having at least one input port;

a plurality of wafer carrier type detection pins disposed on the input port;

a plurality of guide pins disposed on the input port;

a plurality of wafer carrier type detection pins disposed on the input port; and a computer system interfaced with the plurality of wafer carrier type detection pins, whereby the computer system is configured to execute an action sequence when the wafer carrier type is not compatible with the stocker.

The present invention further provides a method for managing the entry of a wafer carrier into a stocker in a semiconductor manufacturing operation comprising the steps of:

identifying the type of the wafer carrier; and executing an action sequence if the type of wafer carrier is not compatible with the stocker.

The present invention further provides a method further comprising the step of associating the wafer carrier type with a customer.

The present invention further provides a method wherein the step of identifying the type of wafer comprises storing wafer type information in an RFID tag affixed to the wafer carrier.

The present invention further provides a method wherein the step of identifying the type of wafer comprises scanning a barcode affixed to the wafer carrier.

The present invention further provides a method wherein the step of identifying the type of wafer comprises examining a plurality of identification pins on the underside of the wafer carrier, wherein the plurality of identification pins are configured and arranged to form a pattern corresponding to the wafer carrier type.

The present invention further provides a method wherein the step of executing the action sequence comprises issuing an operator alert.

The present invention further provides a method wherein the step of executing the action sequence comprises preventing the wafer carrier from entering the stocker.

The present invention further provides a method wherein the step of executing the action sequence comprises rerouting the wafer carrier.

The present invention further provides a method wherein the step of preventing the wafer carrier from entering the stocker comprises disabling the means for accepting a wafer carrier.

DETAILED DESCRIPTION

A shortcoming of the current AMHS is that while it tracks the wafers and routes them to the appropriate location, it does not consider requirements pertaining to the wafer carrier itself, as well as various business and security requirements.

The wafer carrier type may be made of a variety of materials, such as quartz, polypropylene, or polycarbonate, for example. Some materials, such as polycarbonate may be deemed a fire hazard, and therefore may require special storage conditions in a specially equipped temporary storage area. The temporary storage area is often a machine called a "stocker." The stocker stores the empty carriers and carriers with wafers, including but not limited to production lots, engineering lots, and test lots. The wafer carriers are delivered to a stocker after a process step is completed and then later removed and delivered to another tool when the tool is ready. However, not all stockers may have the necessary fire retardant systems in place to accommodate wafer carriers of a particular material. The present invention provides a means for identifying wafer carriers and preventing the wafer carriers from entering a stocker that does not have the proper safety systems in place.

Another issue in wafer fabrication is one of business and/or security. It may be desirable to prevent wafers of a particular customer from residing in a stocker with those from another customer. The motivation for such a policy is to take additional measures to prevent a mistake where one customer inadvertently receives another customer's wafers. This issue can be particularly important with wafers that are used to build devices related to defense or national security, in which case an inadvertent mistake could cause a security breach.

For these reasons, it is desirable to track the wafer carrier, and consider the limitations of the stocker in the implementation of the AMHS.

Figure 1:
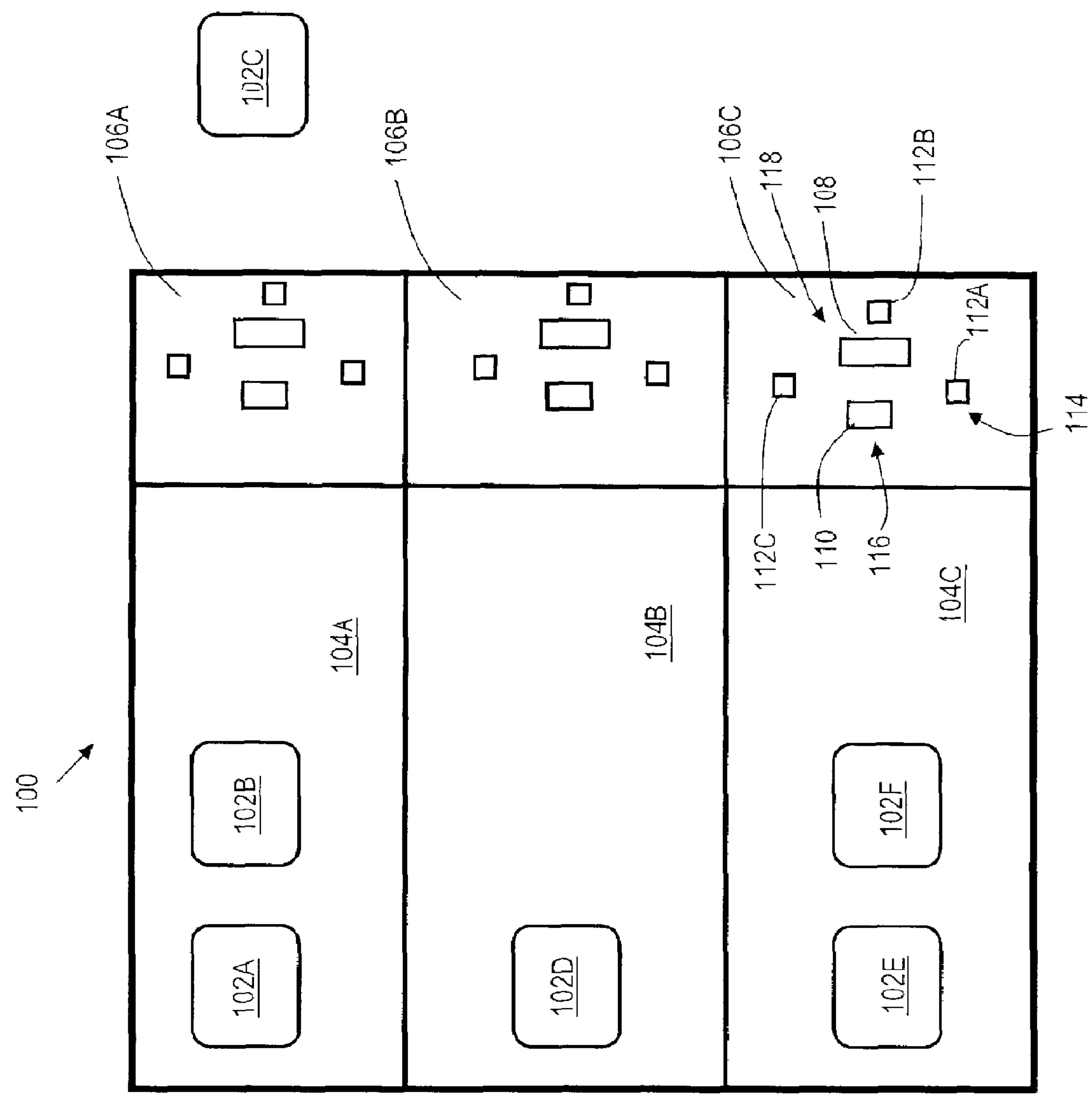
FIG. 1 is a top-view diagram of a stocker in accordance with the present invention.

Referring now to the FIGURES, FIG. 1 is a top-view diagram of a stocker 100 in accordance with the present invention. The stocker 100 has three input ports 106A, 106B, 106C (106A-106C) that load wafer carriers (indicated generally as 102X, where X is a letter designated a particular wafer carrier, such as 102A) into storage areas 104A, 104B, 104C (104A-104C). Each input port (106A-106C) has a means for accepting a wafer carrier, such as a conveyor or robotic handling system (not shown) to bring a wafer carrier, such as 102C, into a storage area, such as 104B. Furthermore, each input port 106A-106C has a means 114 for guiding a wafer carrier 102*x* into the input port, a means 116 for detecting the presence of a wafer carrier at the input port, and a means 118 for identifying the type of wafer carrier. For the purposes of this disclosure, the meaning of the term "type of wafer carrier" may include, but is not limited to, the particular model of wafer carrier, material used to construct the wafer carrier, and/or the customer to which the wafers within the wafer carrier belong.

For the sake of clarity, references for the aforementioned input port means are only indicated for input port 106C. However, similar functionality also exists on input ports 106A and 106B.

A plurality of guide pins 112A, 112B, 112C (112A-112C) serve as a means 114 for guiding a wafer carrier into the proper position within input port 106C. Once the wafer carrier 102*x* is in position, its presence is detected via presence detection sensor 110 which serves as the means 116 for detecting the presence of a wafer carrier. In one embodiment, the presence detection sensor 110 is an electromechanical sensor, such as a plurality of contact pins. In another embodiment, the presence detection sensor 110 is an optical beam system, where the beam is broken by a wafer carrier 102*x* when it is in proper position within the input port 106C, thereby creating a data signal that indicates presence of the wafer carrier.

The type of wafer carrier 102*x* is determined via carrier type detection sensor 108 which serves as the means 118 for identifying the type of wafer carrier. In one embodiment, the carrier type detection sensor 108 is an RFID tag (Radio Frequency Identification Tag) reader that reads an RFID tag that is affixed to a wafer carrier (not shown). In another embodiment, carrier type detection sensor 108 is an optical recognition reader that reads an optical pattern that is affixed to a wafer carrier (not shown). In one embodiment, the optical recognition reader is a barcode reader, and the optical pattern is a barcode. However, the present invention may be practiced with other optical recognition systems, such as an optical character recognition system, without departing from the scope of the present invention. In yet another embodiment, an electromechanical solution, such as a plurality of movable contact pins is used to detect the wafer carrier type.

Figures 2, 3:
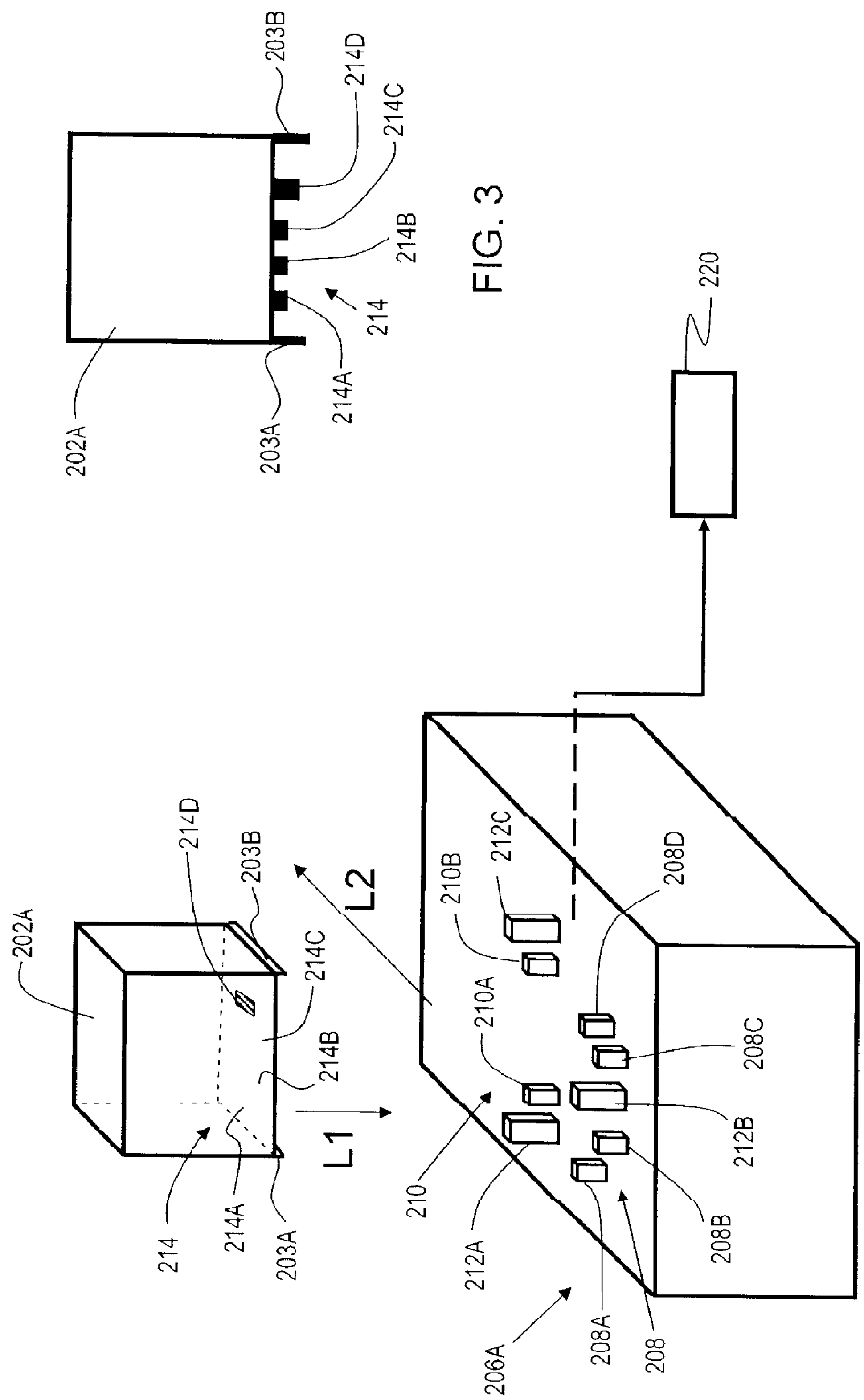
FIG. 2 is a perspective-view diagram illustrating a wafer carrier entering an input port of a stocker in accordance with the present invention.
FIG. 3 is a front view of a wafer carrier illustrating identification pins.

FIG. 2 is a perspective-view diagram illustrating a wafer carrier 202A entering an input port 206A of a stocker (not shown) in accordance with the present invention. Guide pins (212A, 212B, 212C) serve to guide the wafer carrier 202A into proper position within the input port 206A. Wafer carrier 202A is lowered onto the input port 206A by moving it in the direction indicated by arrow L1. In the embodiment shown, the presence detection sensor 210 includes two wafer carrier presence detection pins (210A and 210B) which form the presence detection means 116. Four wafer carrier type, movable detection pins (208A-208D) form the carrier type detection sensor 208. On the underside of the wafer carrier 202A between the legs 203A and 203B are a plurality of identification pins 214A, 214B, 214C, 214D (indicated generally as 214). In particular, pin 214D is a different height than the other pins. The wafer carrier type detection pins 208A-208D, referred to generally as 208 may be displaced by the identification pins 214 when the wafer carrier 202A is in position on input port 206A. The wafer carrier type detection pins 208A-208D provide an indication of wafer carrier type, and are interfaced to a computer system 220 as is known in the art. The amount of displacement of each pin 208A-208D depends on the height of the identification pins (indicated generally as 214). The amount of displacement of each detection pin 208A-208D determines a pattern that corresponds to a particular wafer carrier type. The computer system 220, which may be part of the AMHS, or an independent computer system, compares the identified wafer carrier type to a predetermined list of approved wafer carrier types for given stockers. If the identified wafer carrier type matches one of the approved wafer carrier types, the stocker and wafer carrier type are deemed compatible, and the wafer carrier is admitted into the appropriate stocker storage area. When the type of wafer carrier does not match one of the approved wafer carrier types, an action sequence is initiated. The action sequence comprises one or more actions taken by the system in response to this condition. In one embodiment, the action sequence is executed by the AMHS. In another embodiment, the action sequence is executed by a computer system independent of the AMHS. The action sequence taken when the type of wafer carrier does not match one of the approved carrier types depends upon the specifics of the situation, such as the operational policies of the manufacturing facility. Below are some examples of action sequences when a mismatch between the wafer carrier being admitted to a stocker storage area and a wafer carrier approved for that stocker storage area. This list should not be interpreted as limiting, as many other action sequences are possible.

Action Sequence 1:

Reroute wafer carrier to another stocker that is compatible for a wafer carrier of the identified type.

Action Sequence 2:

Admit the wafer carrier to the stocker.

Issue an operator alarm (such as a visual and/or aural indicator) to alert an operator to the situation.

Action Sequence 3:

Deny entry of the wafer carrier to the stocker.

Disable the means for accepting the wafer carrier.

Issue an operator alarm (such as a visual and/or aural indicator) to alert an operator to the situation.

FIG. 3 is a front view of wafer carrier 202 A illustrating identification pins 214A-214D. In one embodiment, each identification pin 214 can be of a different length, such as a short pin 214A or a long pin 214D. The identification pins press on the corresponding carrier type detection pins (208A-208D) of input port 206A. With a four pin configuration, it is possible to represent a total of 16 wafer carrier types. Other embodiments may incorporate more pins to increase the number of different wafer carrier types that can be represented.

Figure 4:
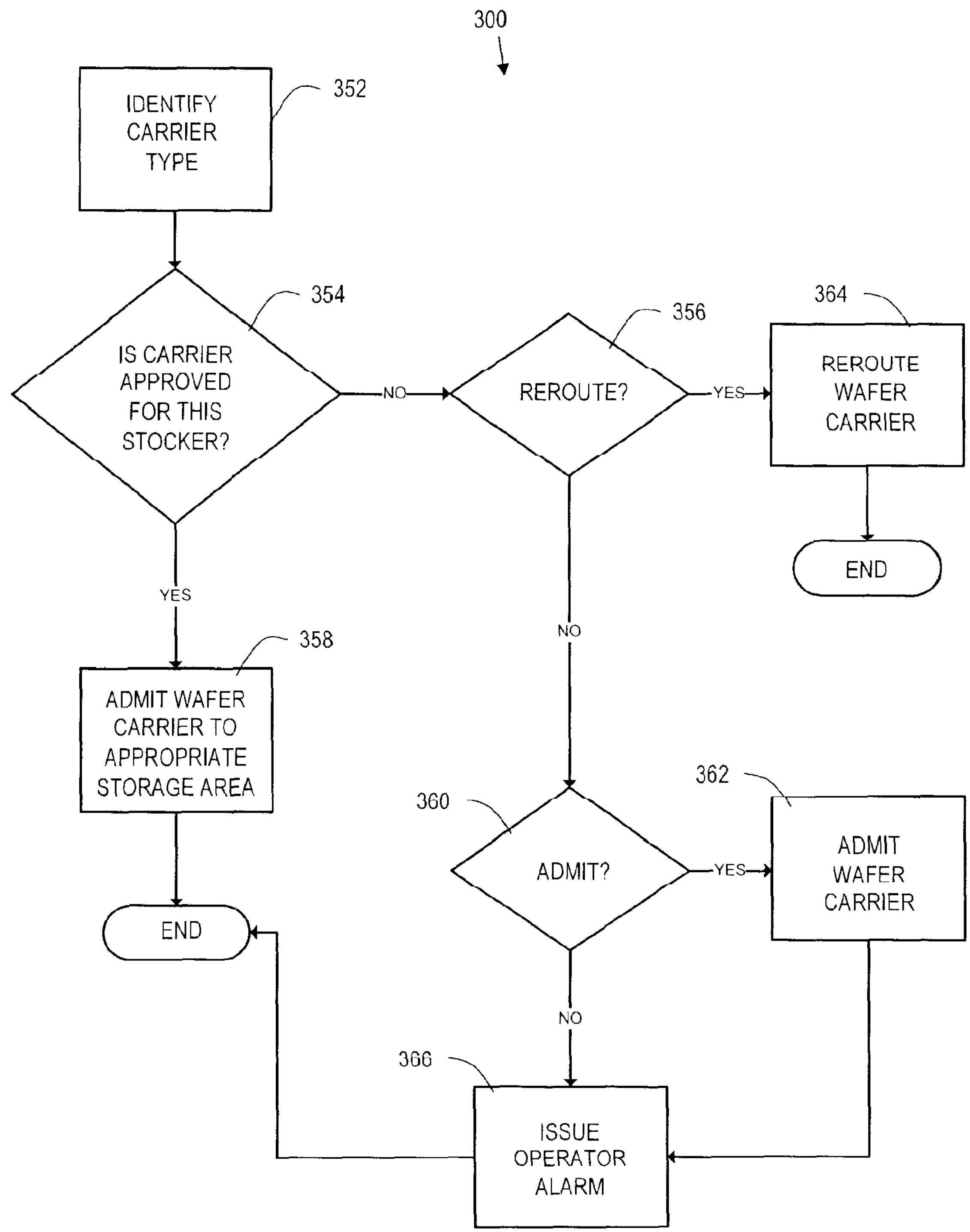
FIG. 4 is a flowchart indicating process steps for carrying out the method of the present invention.

FIG. 4 is a flowchart 300 indicating process steps for carrying out the method of the present invention. In process step 352, the wafer carrier type is identified, via the type detection sensor (108 of FIG. 1). Next, in process step 354, the identified wafer carrier type is compared to a predetermined list of approved wafer carrier types for a given stocker to determine if the wafer carrier may safely enter the stocker. If so, the stocker is admitted to the wafer carrier in step 358. If the wafer carrier is not approved for entry into this stocker, then one or more actions may occur depending on the policy that is implemented. In step 356 a decision is made to reroute the wafer carrier if the AMHS is configured to do so. If so, the wafer carrier is rerouted, for example, to an alternate stocker in process step 364. If the wafer carrier is not to be rerouted, then in process step 360 a check is made to see if the wafer carrier can be admitted anyway. If so, the wafer carrier is admitted to the stocker in process step 362, and then an operator alarm is issued in process step 366. In this way, a wafer carrier can be temporarily stored in the stocker, and an operator, upon being so alerted, can rectify the situation. Alternatively, the wafer carrier may be denied admittance into the stocker (a "no" result in step 360). In this case, an alarm is issued in process step 366 to alert the operator to the situation so it may be corrected.

It will be understood that the present invention may have various other embodiments. Furthermore, while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A method for managing the entry of a wafer carrier into a stocker in a semiconductor manufacturing operation comprising the steps of:

identifying the type of the wafer carrier, wherein identifying the type of wafer carrier comprises identifying the model of the wafer carrier and the material used to construct the wafer carrier;

determining the compatibility of the identified wafer carrier type with the stocker by comparing the identified wafer carrier type to a predetermined list of approved wafer carrier types for the stocker; and executing an action sequence responsive to determining the identified wafer carrier type is not compatible with the stocker.

2. The method of claim 1, further comprising the step of associating the wafer carrier type with a customer.

3. The method of claim 2, wherein the step of identifying the type of wafer carrier comprises storing wafer type information in an RFID tag affixed to the wafer carrier.

4. The method of claim 2, wherein the step of identifying the type of wafer carrier comprises scanning a barcode affixed to the wafer carrier.

5. The method of claim 2, wherein the step of identifying the type of wafer carrier comprises examining a plurality of identification pins on the underside of the wafer carrier, wherein said plurality of identification pins are configured and arranged to form a pattern corresponding to the wafer carrier type.

6. The method of claim 2, wherein the step of executing the action sequence comprises issuing an operator alert.

7. The method of claim 2, wherein the step of executing the action sequence comprises preventing the wafer carrier from entering the stocker.

8. The method of claim 2, wherein the step of executing the action sequence comprises rerouting the wafer carrier.

9. The method of claim 2, wherein the step of preventing the wafer carrier from entering the stocker comprises disabling a means for accepting a wafer carrier.

* * * * *